(12) United States Patent
Li

(10) Patent No.: US 7,708,590 B1
(45) Date of Patent: May 4, 2010

(54) ELECTRICAL CONNECTOR FOR MOUNTING ON CIRCUIT BOARD

(75) Inventor: Zhan-Yang Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/508,833

(22) Filed: Jul. 24, 2009

(30) Foreign Application Priority Data

Sep. 11, 2009 (CN) .................. 2009 2 0303031

(51) Int. Cl.
*H01R 13/66* (2006.01)
(52) U.S. Cl. ..................................... 439/567
(58) Field of Classification Search ............. 439/567, 439/60, 61, 572, 571, 59
See application file for complete search history.

(56) References Cited

U.S. PATENT DOCUMENTS 5,230,638 A * 7/1993 DiViesti ............... 439/567
2007/0293085 A1* 12/2007 Marcade et al. ......... 439/567

* cited by examiner

*Primary Examiner*—Phuong K Dinh
(74) *Attorney, Agent, or Firm*—D. Austin Bonderer

(57) ABSTRACT

A circuit board includes a board body of a thickness, and a socket. The board body defines a plurality of through holes therein. The socket includes a first line of short pin groups and a second line of long pin groups engaging the through holes of the board body. The socket defines a slot. The first line of short pin groups and the second line of long pin groups are respectively located on opposite sides of the slot. The first line of short pin groups has a length less than the thickness of the board body. The second line of long pin groups has a length sufficient that the second line of pin groups protrudes the board body.

17 Claims, 6 Drawing Sheets

ELECTRICAL CONNECTOR FOR MOUNTING ON CIRCUIT BOARD

BACKGROUND

1. Technical Field

The present disclosure relates to circuit boards, and particularly to a circuit board with sockets.

2. Description of Related Art

A primary circuit board often includes a plurality of sockets configured for electrically connecting with other circuit boards so as to add functions of the other circuit boards. However, since pins of each socket are exposed on the primary circuit board from one side to another opposite side thereof, the primary circuit board can only secure one socket in a position on one side of the circuit board, and not two sockets in the same position on opposite sides thereof.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
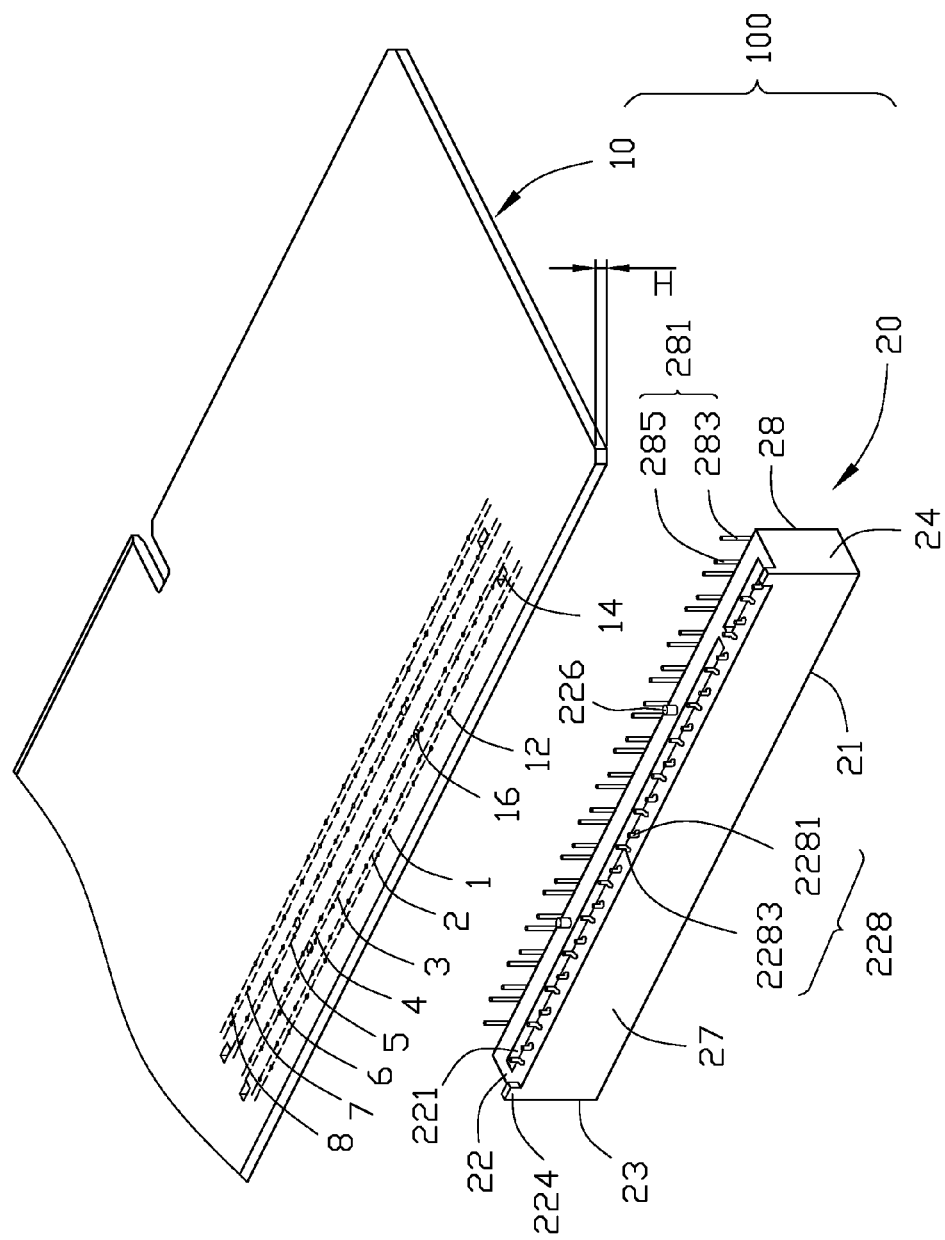
FIG. 1 is an exploded, isometric view of a circuit board.
Figure 2:
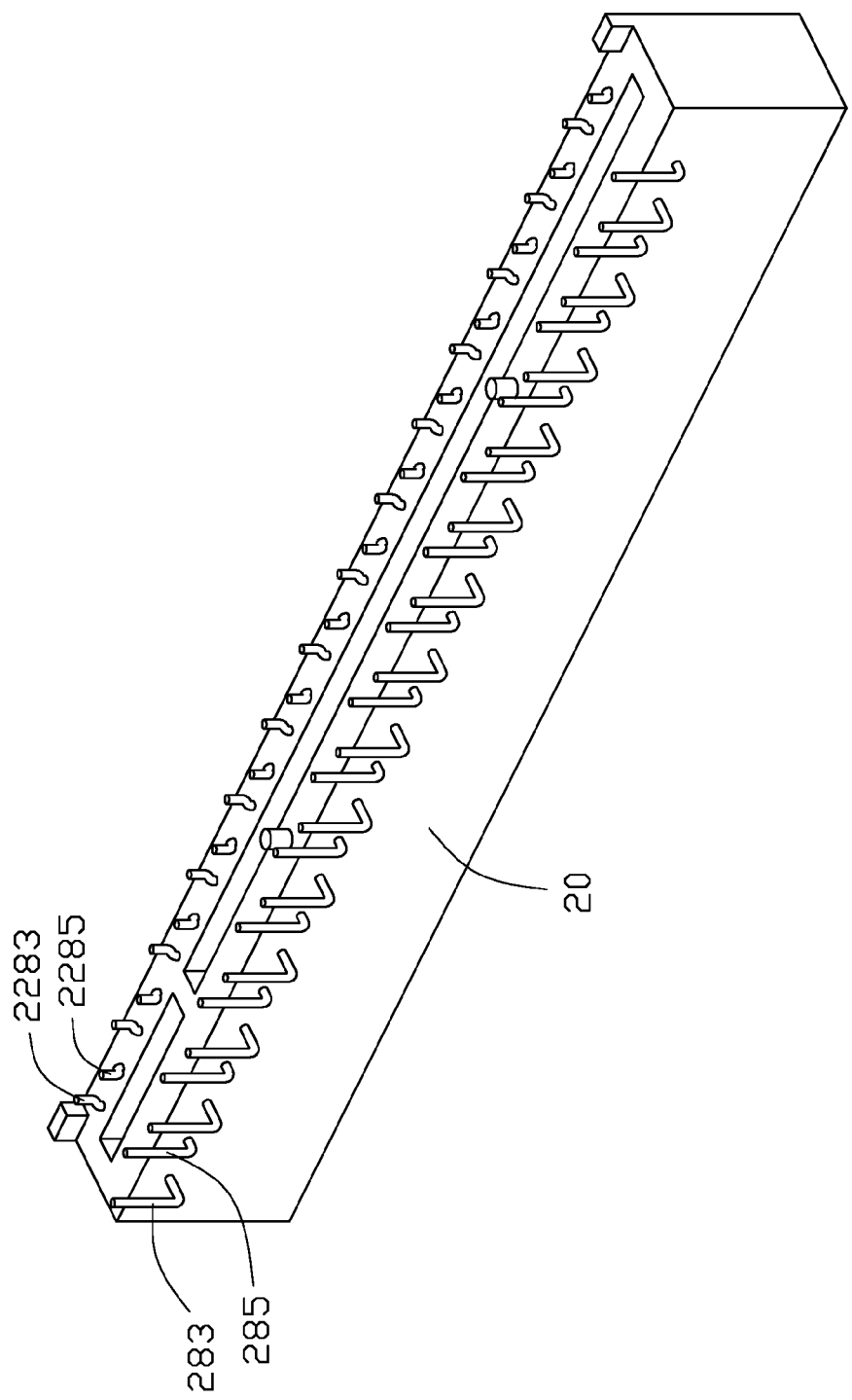
FIG. 2 is another isometric view of the socket of FIG. 1.

Referring to FIG. 1, an embodiment of a circuit board 100 includes a board body 10 and a socket 20 capable of being secured on the board body 10.

The board body 10 is a generally rectangular thin plate, having a thickness H. A plurality of through holes 12 is defined in the board body 10, and arranged in eight lines designated by numbers 1, 2, 3, 4, 5, 6, 7, and 8. Each line includes fourteen through holes 12. Four rectangular positioning openings 14 and four circular positioning openings 16 are defined in the board body 10.

Figure 3:
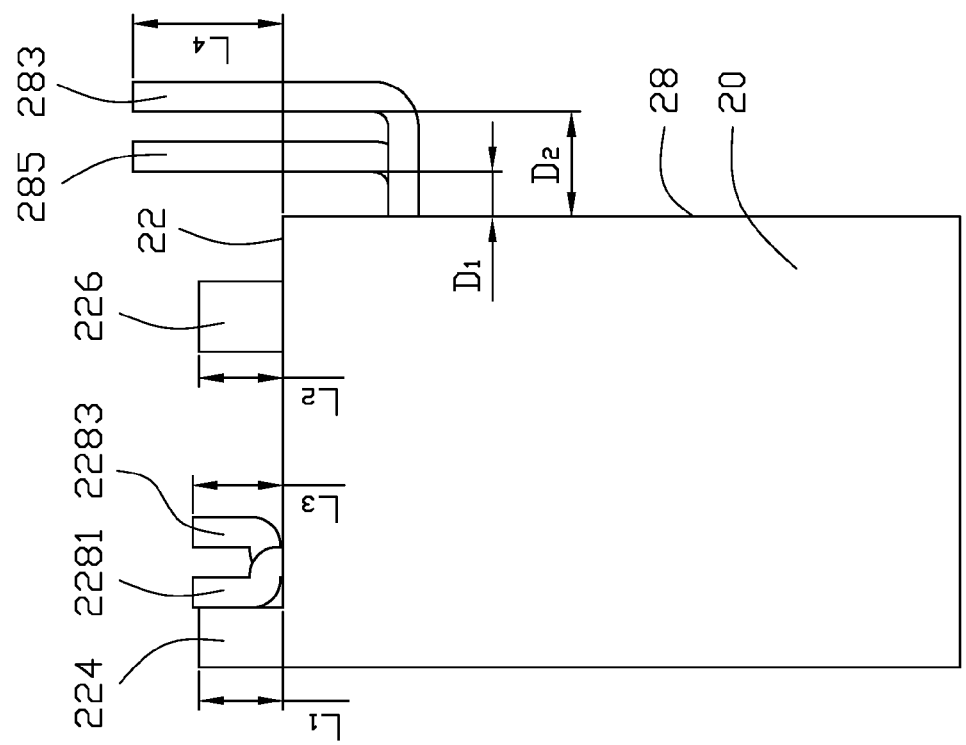
FIG. 3 is a side view of the socket of FIG. 2.

The socket 20 is generally cuboid, and includes a bottom wall 21, a top wall 22 parallel to the bottom wall 21, and four sidewalls 23, 24, 27, 28 perpendicular to the bottom wall 21. Sidewall 23 is parallel to the sidewall 24, and perpendicular to the sidewall 27, which is parallel to the sidewall 28. A slot 221 is defined in the socket 20 and extends through from the bottom wall 21 and the top wall 22. Two generally rectangular positioning tabs 224 respectively protrude from two corners of the top wall 22 on one side of the slot 221, and two generally columnar positioning tabs 226 respectively protrude from the top wall 22 on another side of the slot 221. A plurality of metal finger pieces (not shown) is received in two opposite inner surfaces of the slot 221, and capable of electrically connecting with finger pieces of additional cards (not shown), such as network cards, expansion cards, memory cards, and others. Lengths L1, L2 (shown in FIG. 3) of the positioning tabs 224, 226 are less than the thickness H of the board body 10.

A first line of short pin groups 228 is located on the top wall 22 between the two positioning tabs 224 at one side of the slot 221. The first line of short pin groups 228 includes fourteen first short pins 2281 bent in a first direction, and fourteen second short pins 2283 bent in a second direction opposite to the first direction. The first short pins 2281 and the second short pins 2283 are capable of engaging two lines (designated by 3, 4) of the through holes 12 of the board body 10. Each two adjacent first short pins 2281 are separated by one second short pin 2283, and each two adjacent second short pins 2282 are separated by one first short pin 2281 until the ends.

A second line of long pin groups 281 is located on the sidewall 28 at another opposite side of the slot 221. The first line of long pin groups 281 includes fourteen first long pins 283 and fourteen second long pins 285 bent in the same direction. The first long pins 283 and the second long pins 285 are capable of engaging two lines (designated by 7, 8) of the through holes 12 of the board body 10. Each two adjacent first long pins 283 are separated by one second long pin 285, and each two adjacent second long pins 285 are separated by one first long pin 283 until the end.

Each of the first and second short pins 2281, 2283 of the first line of short pin groups 228 has a same length L3, which does not exceed the thickness H of the board body 10. Each of the first and second long pins 283, 285 of the second line of long pin groups 281 has a portion extending out of the top wall 22, and a length L4 exceeding the thickness H of the board body 10. A distance D1 between the portion of each of the first long pins 283 and the sidewall 28 is less than a distance D2 between the portion of each of the second long pins 285 and the sidewall 28.

Figure 4:
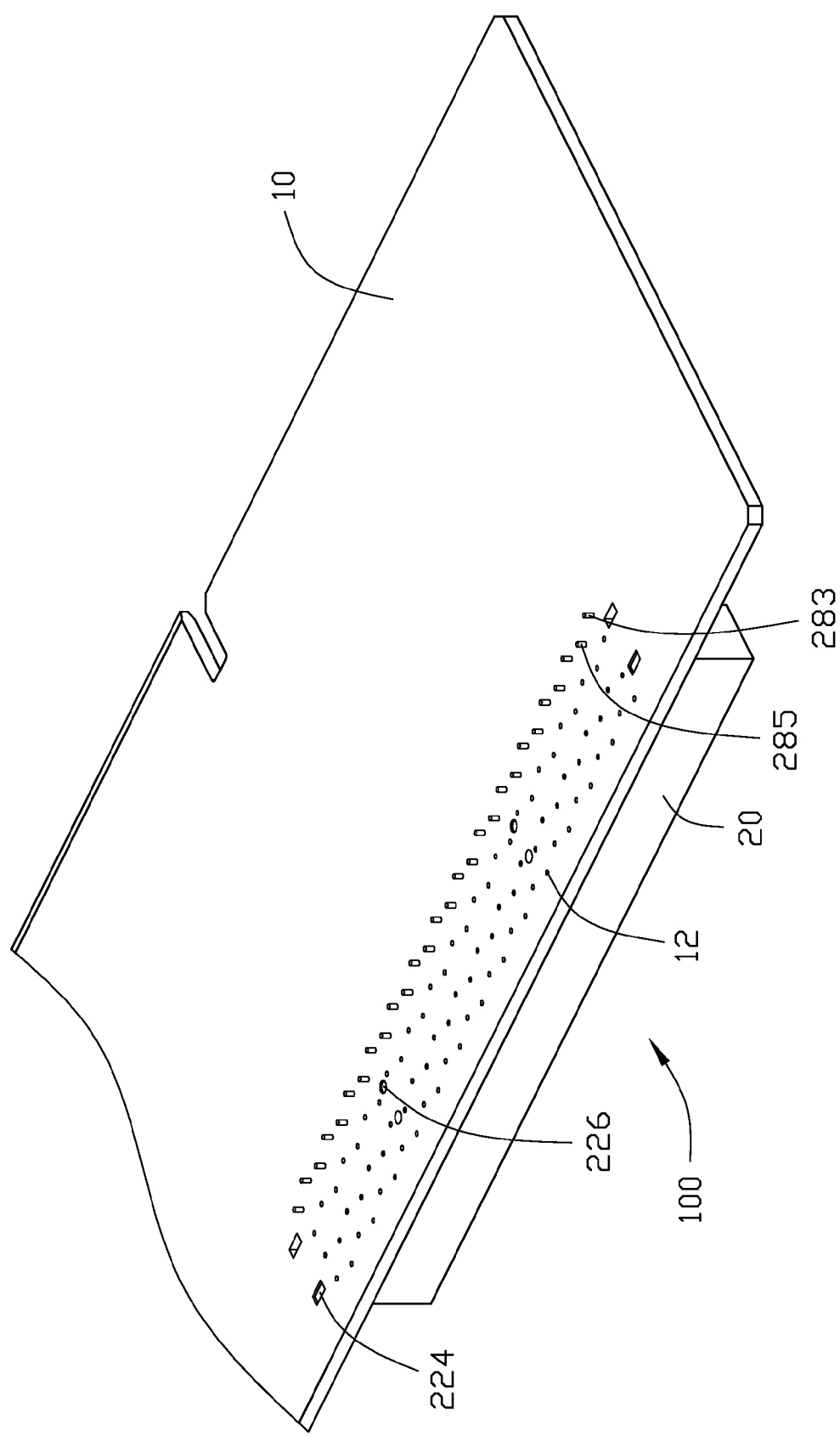
FIG. 4 is an assembled view of FIG. 1.
Figure 5:
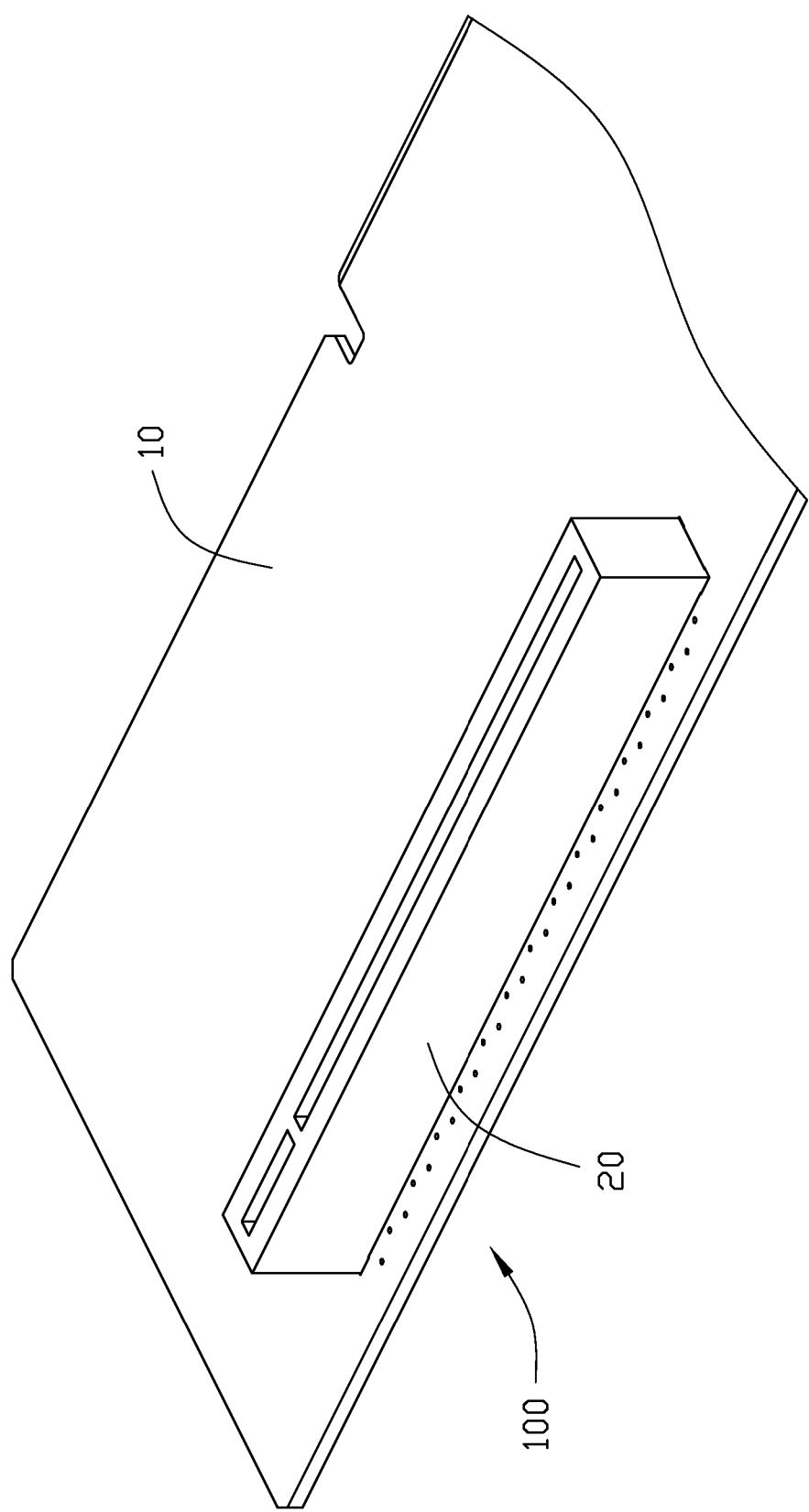
FIG. 5 is similar to FIG. 4, but viewed from another aspect.

Referring also to FIGS. 4-5, when the socket 20 is secured on one side of the board body 10, the first short pins 228 and the second short pins 2283 of the first line of short pin groups 228 engage the corresponding two lines (3, 4 lines) of the through hole 12 of the board body 10. The positioning tabs 224, 226 engage the corresponding positioning holes 14, 16 of the board body 10. The first long pins 283 and the second long pins 285 of the second line of long pin groups 281 engage the corresponding two lines (7, 8 lines) of the through hole 12 of the board body 10. Since the Lengths L1, L2 of the positioning tabs 224, 226, and the length L3 of the first and second short pins 2281, 2283 do not exceed the thickness H of the board body 10, the positioning tabs 224, 226 and the first and second short pins 2281, 2283 do not protrude from the other opposite side of the board body 10. Since the length L4 of the first and second long pins 283, 285 exceeds the thickness H of the board body 10, the first and second long pins 283, 285 protrude from the opposite side of the board body 10. The first and second long pins 283, 285 are fixed on the board body 10 by welding, and the socket 20 can be fixed on one side of the board body 10.

Figure 6:
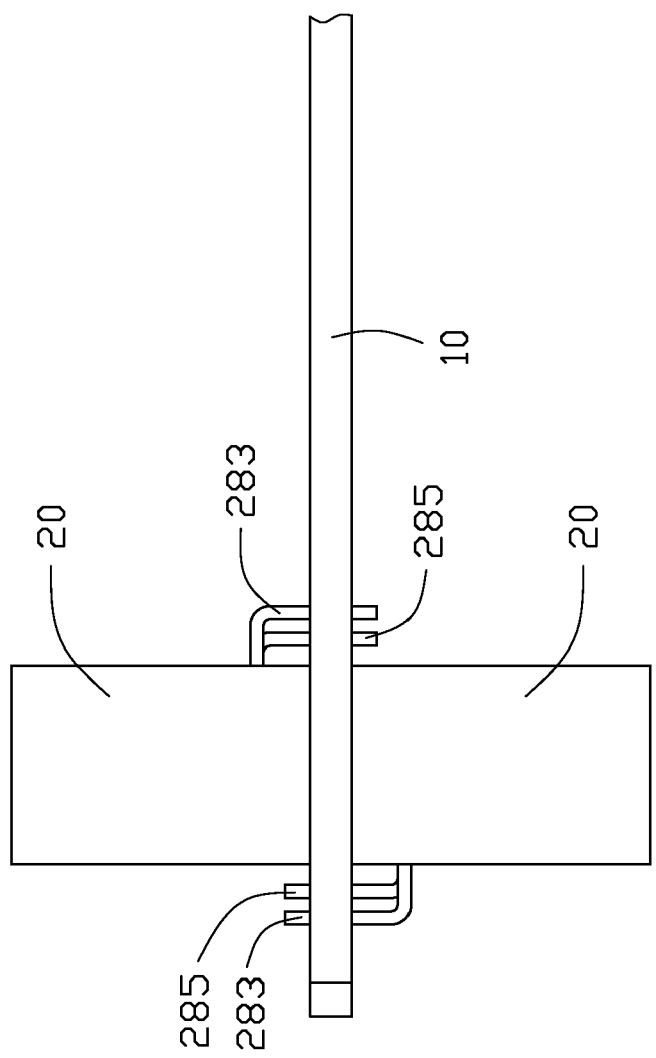
FIG. 6 is a side view of FIG. 5, showing another socket secured on the board body.

Referring also to FIGS. 4-6, since there still remain four lines (1, 2, 5, 6 lines) of through holes 12 and four positioning openings 14, 16 in the board body 10, and the positioning tabs 24, 26 and the first and second short pins 2281, 2283 do not protrude from the other side of the board body 10, another socket 20 can be secured on the other side of the board body 10 in the same position as the secured socket 20. Therefore, two sockets 20 can be secured almost in the same position on opposite sides of the board body 10.

It is to be understood, however, that even though numerous characteristics and advantages have been set forth in the foregoing description of embodiments, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A circuit board comprising:
   a board body of a thickness, defining a plurality of through holes therein; and
   a socket to be mounted to the board body comprising a first line of short pin groups and a second line of long pin groups engaging the through holes of the board body, the socket defining a slot, the first line of short pin groups and the second line of long pin groups being respectively located on opposite sides of the slot, wherein the first line of short pin groups has a length less than the thickness of the board body, the second line of long pin groups has a length sufficient that the second line of pin groups protrudes the board body, the slot opening at a board body mounting face of the socket.

2. The circuit board of claim 1, wherein the first line of short pin groups comprises a plurality of first short pins bent in a first direction, and a plurality of second short pins bent in a second direction; the first and second short pins' location alternates on the socket.

3. The circuit board of claim 1, wherein the second line of long pin groups comprises a plurality of first and second long pins bent in the same direction; the first and second long pins' location alternates on the socket.

4. The circuit board of claim 3, wherein a distance between a sidewall of the socket and a portion of each of the first long pins is greater than a distance between the sidewall and a portion of each of the second long pins.

5. The circuit board of claim 1, wherein a plurality of positioning tabs is located on opposite sides of the slot; the board body defines a plurality of positioning openings for receiving the positioning tabs.

6. The circuit board of claim 5, wherein the positioning tabs positioned on one side of slot have a generally circular cross-section.

7. The circuit board of claim 6, wherein the positioning tabs positioned on the other side of the slot have a generally rectangular cross-section.

8. A circuit board comprising:
   a board body defining a plurality of through holes therein;
   two sockets positioned in the same position on opposite sides of the board body, each of the sockets having a first line of short pin groups engaging the through holes of the board body, each of the sockets defining a slot, the first line of short pin groups being located on one side of the slot, and having lengths less than the thickness of the board body so as to prevent the first line of short pin groups of one of the two sockets on one side of the board body from intervening with the other one socket positioned on the opposite side of the board body by extending out from the one side of the board body to the opposite side.

9. The circuit board of claim 8, wherein the first line of short pin groups comprises a plurality of first short pins bent in a first direction, and a plurality of second short pins bent in a second direction opposite to the first direction; the first and second short pins' location alternates on the socket.

10. The circuit board of claim 8, wherein each of the sockets further comprises a top wall and a sidewall perpendicular to the top wall, a second line of long pin groups is located on the sidewall.

11. The circuit board of claim 10, wherein the first line of short pin groups is located on one side of the slot, and the second line of long pin groups is located on the other opposite side of the slot.

12. The circuit board of claim 10, wherein the second line of long pin groups comprises a plurality of first and second long pins bent in a same direction.

13. The circuit board of claim 12, wherein a distance between the sidewall and a portion of each of the first long pins is greater than a distance between the sidewall and a portion of each of the second long pins.

14. The circuit board of claim 10, wherein a plurality of positioning tabs is located on the top wall on opposite sides of the slot; and the board body defines a plurality of positioning openings for receiving the positioning tabs.

15. The circuit board of claim 14, wherein the positioning tabs positioned on one side of slot have a generally circular cross-section.

16. The circuit board of claim 15, wherein the positioning tabs positioned on the other side of the slot have a generally rectangular cross-section.

17. The circuit board of claim 12, wherein the first and second long pins' location alternates on the socket.

* * * * *